(12) United States Patent
Chikagawa et al.

(10) Patent No.: US 6,946,415 B2
(45) Date of Patent: Sep. 20, 2005

(54) COMPOSITION FOR INSULATING CERAMICS AND INSULATING CERAMICS USING THE SAME

(75) Inventors: Osamu Chikagawa, Shiga-ken (JP); Sadaaki Sakamoto, Shiga-ken (JP); Yoichi Moriya, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 132 days.

(21) Appl. No.: 10/296,929

(22) PCT Filed: Mar. 26, 2002

(86) PCT No.: PCT/JP02/02891

§ 371 (c)(1),
(2), (4) Date: Jul. 30, 2003

(87) PCT Pub. No.: WO02/079114

PCT Pub. Date: Oct. 10, 2002

(65) Prior Publication Data

US 2004/0029701 A1 Feb. 12, 2004

(30) Foreign Application Priority Data

Mar. 28, 2001 (JP) ........................................ 2001-093982
Mar. 26, 2002 (WO) .............................. PCT/JP02/02891

(51) Int. Cl.[7] ............................................. C03C 14/00
(52) U.S. Cl. ........................ 501/32; 501/65; 501/66; 501/69; 501/70; 501/72; 501/73; 501/77; 428/428; 428/432; 428/697; 156/89.12; 156/89.16; 257/700; 257/703

(58) Field of Search ............................ 501/32, 65, 66, 501/69, 70, 72, 73, 77; 257/700, 703; 156/89.12, 89.16; 428/428, 432, 697

(56) References Cited

U.S. PATENT DOCUMENTS

| 4,788,046 A | * 11/1988 | Barringer et al. ........... 264/661 |
| 5,082,811 A | 1/1992 | Bruno |
| 5,756,408 A | * 5/1998 | Terashi et al. .................. 501/8 |
| 2001/0029228 A1 | 10/2001 | Terashi |

FOREIGN PATENT DOCUMENTS

| JP | 08301651 A | * 11/1996 | ........... C04B/35/16 |
| JP | 2001-240470 | 9/2001 | |
| JP | 2002-029827 | 1/2002 | |
| WO | WO 98/22405 A | * 5/1998 | |

* cited by examiner

*Primary Examiner*—David Sample
(74) *Attorney, Agent, or Firm*—Dickstein, Shapiro, Morin & Oshinsky, LLP.

(57) ABSTRACT

An insulating ceramic composition includes a mixture of a ceramic powder containing $MgAl_2O_4$ and a glass powder containing 30–60% by mole of silicon oxide on the basis of $SiO_2$ and 20–55% by mole of magnesium oxide on the basis of MgO, and the ceramic powder further includes $Mg_2SiO_4$ and $TiO_2$. The insulating ceramic composition can be fired at 1000° C. and co-sintered with Ag and Cu. An insulating ceramic obtained by sintering the insulating ceramic composition has a high Q-factor and is therefore suitable for ceramic multilayer substrates used at high frequencies.

20 Claims, 5 Drawing Sheets

COMPOSITION FOR INSULATING CERAMICS AND INSULATING CERAMICS USING THE SAME

TECHNICAL FIELD

The present invention relates to insulating ceramic compositions used for, for example, multilayered circuit boards. The present invention particularly relates to an insulating ceramic composition that is suitable for a composite multilayered circuit board for mounting semiconductor elements and various electronic elements and is capable of being fired together with conductive materials such as copper and silver; an insulating ceramic, a ceramic multilayer substrate, and a ceramic electronic component that are produced by sintering an insulating ceramic composition; and a method for manufacturing a ceramic multilayer substrate.

BACKGROUND ART

Recently, electronic devices having high-speed processing performances and using higher frequencies have been increasing and therefore electronic components used for such electronic devices must also have high-speed processing performances and use higher frequencies. Since the miniaturization of electronic devices has been advancing, electronic components must be miniaturized and mounted in high density.

In order to meet such requirements, multilayered circuit boards for mounting semiconductor elements and various electronic elements are employed. In such multilayered circuit boards, conductor circuits and electronic functional elements are arranged in a substrate, and therefore electronic components can be miniaturized.

A principal material for the multilayered circuit board includes aluminum. Since the firing temperature of aluminum is 1500–1600° C., refractory metals such as Mo, Mo—Mn, and W must be used for conductor materials of circuits contained in alumina multilayered circuit boards. However, there is a problem in that such refractory metals are expensive and have a high electrical resistance.

Therefore, there is a large demand for using an inexpensive metal, for the conductor materials, having a smaller electrical resistance than those of the above refractory metals, wherein the inexpensive metal includes, for example, copper. For example, in Japanese Unexamined Patent Application Publication No. 5-238774, in order to realize the use of copper for the conductor materials, a substrate material such as a glass ceramic and crystallized glass which are capable of being fired at 1000° C. or less is proposed. In Japanese Unexamined Patent Application Publication No. 8-34668, in consideration of the connection to semiconductor devices such as Si chips, the application of a ceramic having a thermal expansion coefficient close to that of Si to multilayered circuit board materials is proposed. However, there is a problem in that such substrate materials have a small mechanical strength and a small Q-factor and that the kinds and the ratio of deposited crystal phases are affected by the firing process.

Chip components such as semiconductor devices are mounted on ceramic multilayer substrates including an insulating ceramic composition in some cases. On the other hand, ceramic multilayer substrates having chip components thereon are mounted on circuit boards such as printed circuit boards for ceramic electronic components. Thus, input/output terminals for inputting/outputting signals are essential for such ceramic electronic components and the distance between the input/output terminals must be small due to the miniaturization of electronic components.

Therefore, insulating ceramics produced by firing insulating ceramic compositions must have high dimensional accuracy. However, insulating ceramics produced by firing conventional insulating ceramic compositions have insufficient dimensional accuracy.

The present invention has been made in order to solve the above problems, and it is an object of the present invention to provide an insulating ceramic composition (1) that is capable of being fired together with a low-melting conductive material such as silver and copper and (2) that can provide an insulating ceramic having a small relative dielectric constant, excellent high-frequency characteristics, and a relatively high thermal expansion coefficient.

It is another object of the present invention to provide an insulating ceramic that is obtained by low-temperature firing and has a small relative dielectric constant, excellent high-frequency characteristics, and a relatively high thermal expansion coefficient.

It is another object of the present invention to provide a ceramic multilayer substrate and ceramic electronic component including an insulating ceramic composition according to the present invention and having excellent high-frequency characteristics and a high-density circuit pattern.

It is another object of the present invention to provide a method for manufacturing a ceramic multilayer substrate that can be obtained by low-temperature firing and has excellent high-frequency characteristics and dimensional accuracy and in which a high-density circuit pattern can be formed.

DISCLOSURE OF INVENTION

The present invention provides an insulating ceramic composition (herein referred to as a first insulating ceramic composition of the present invention in some cases) including a ceramic powder containing spinel ($MgAl_2O_4$), a glass powder containing 30–60% by mole of silicon oxide on the basis of $SiO_2$ and 20–55% by mole of magnesium oxide on the basis of MgO, and titanium oxide.

In the first insulating ceramic composition of the present invention, the titanium oxide is preferably contained in the ceramic powder. The content of the titanium oxide is preferably 0.5–15% by weight with respect to the total ceramic powder and glass powder content.

The present invention provides an insulating ceramic composition (herein referred to as a second insulating ceramic composition of the present invention in some cases) including a ceramic powder containing spinel ($MgAl_2O_4$) and a glass powder containing 30–60% by mole of silicon oxide on the basis of $SiO_2$ and 20–55% by mole of magnesium oxide on the basis of MgO, wherein part of the spinel in the ceramic powder is replaced with $Mg_2SiO_4$.

In the second insulating ceramic composition of the present invention, 15% by weight or less of the spinel is preferably replaced with the $Mg_2SiO_4$ with respect to 100% by weight of the spinel.

In the first or second insulating ceramic composition of the present invention, the glass powder preferably further contains 20% by mole or less of boron oxide on the basis of $B_2O_3$. The glass powder preferably further contains 30% by mole or less of at least one oxide selected from the group consisting of CaO, SrO, BaO, and ZnO. The glass powder preferably further contains 10% by mole or less of aluminum oxide on the basis of $Al_2O_3$. The glass powder preferably further contains 10% by mole or less of at least one alkaline metal oxide selected from the group consisting of $Li_2O$, $K_2O$, and $Na_2O$ with respect to 100% by mass of the glass powder.

The first or second insulating ceramic composition preferably further includes 3% by weight or less of copper oxide on the basis of CuO with respect to the total ceramic powder and glass powder content.

In the first or second insulating ceramic composition of the present invention, the ratio of the ceramic powder content to the glass powder content is preferably 20:80 to 80:20 on the weight basis.

The present invention provides an insulating ceramic produced by firing the first or second insulating ceramic composition of the present invention.

The present invention provides a ceramic multilayer substrate including a plurality of ceramic layers and a conductive wire disposed on at least one of the plurality of ceramic layers, wherein the plurality of ceramic layers include an insulating ceramic layer comprising the insulating ceramic of the present invention.

In the ceramic multilayer substrate of the present invention, the plurality of ceramic layers may further include a dielectric ceramic layer that is disposed on at least one principal face of the insulating ceramic layer and that has a dielectric constant higher than that of the insulating ceramic layer.

The present invention provides a ceramic electronic component including the ceramic multilayer substrate of the present invention and a circuit element that is mounted on the ceramic multilayer substrate and is electrically connected to the conductive wire.

The present invention provides a ceramic electronic component including the ceramic multilayer substrate of the present invention and a conductive wire connected to at least one of an inductor and a capacitor which are circuit elements.

The present invention provides a method for manufacturing a ceramic multilayer substrate comprising the steps of layering first green ceramic sheets including the first or second insulating ceramic composition of the present invention to prepare a layered body, providing a second green ceramic sheet having a sintering temperature different from that of the first green ceramic sheets onto at least one principal face of the layered first green ceramic sheets, and firing the layered body including the first green ceramic sheets together with the second green ceramic sheet.

In the method for manufacturing a ceramic multilayer substrate of the present invention, preferably, the second green ceramic sheet is not substantially sintered at the sintering temperature of the first green ceramic sheets. The layered body including the first green ceramic sheets is preferably fired at 1000° C. or less together with the second green ceramic sheet.

BEST MODE FOR CARRYING OUT THE INVENTION

A first insulating ceramic composition of the present invention includes at least a ceramic powder containing spinel ($MgAl_2O_4$) and a glass powder containing 30–60% by mole of silicon oxide on the basis of $SiO_2$ and 20–55% by mole of magnesium oxide on the basis of MgO, and the ceramic powder further contains titanium oxide ($TiO_2$).

In the ceramic powder contained in the insulating ceramic composition, $MgAl_2O_4$, which is a main component, has excellent high-frequency characteristics and a high flexural strength, and $TiO_2$, which is an auxiliary component, functions as a nucleating agent for accelerating the crystallization of glass components. Thus, an insulating ceramic having the following characteristics can be obtained by firing the insulating ceramic composition: high strength, an excellent high-frequency characteristic, that is, a large Q-factor at high frequencies.

In the insulating ceramic composition, when the glass powder contains Ca, the sintered insulating ceramic composition has a large Q-factor because of the precipitation of a crystal with a large Q-factor, but Ca remains in glass. In the step of forming external electrodes on the insulating ceramic by a plating process and the like, when Ca remains in glass, the Ca elutes into the plating solution to make the glass fragile. When the insulating ceramic composition contains $TiO_2$, the $TiO_2$ reacts with the Ca remaining in the glass having the precipitated crystal with a large Q-factor to form $CaTiO_3$. Therefore, the insulating ceramic composition produced by firing the first insulating ceramic composition is improved in plating resistance.

$CaTiO_3$ has a relatively large thermal expansion coefficient and the precipitation thereof can be controlled with the $TiO_2$ content, thereby controlling the thermal expansion coefficient of the insulating ceramic. Furthermore, since $TiO_2$ and $CaTiO_3$ has a negative temperature coefficient of a dielectric constant, the temperature coefficient of the dielectric constant of the insulating ceramic can be controlled with the $TiO_2$ content.

Accordingly, the first insulating ceramic composition of the present invention preferably contains 0.5–15% by weight of $TiO_2$ with respect to the total ceramic powder and glass powder content. When the $TiO_2$ content is less than 0.5% by weight, the temperature coefficient of the dielectric constant becomes an excessively large positive value. When the $TiO_2$ content is more than 15% by weight, the temperature coefficient of the dielectric constant becomes an excessively large negative value.

In the first insulating ceramic composition, $TiO_2$ is preferably contained in the ceramic powder.

A second insulating ceramic composition of the present invention includes a ceramic powder containing spinel ($MgAl_2O_4$) and a glass powder containing 30–60% by mole of silicon oxide on the basis of $SiO_2$ and 20–55% by mole of magnesium oxide on the basis of MgO, wherein part of the spinel in the ceramic powder is replaced with $Mg_2SiO_4$.

In the ceramic powder in the second insulating ceramic composition, $MgAl_2O_4$, which is a main component, has excellent high-frequency characteristics and high flexural strength, and $Mg_2SiO_4$, which is an auxiliary component, has excellent high-frequency characteristics and a large thermal expansion coefficient. Thus, an insulating ceramic having the following characteristics can be obtained by firing the insulating ceramic composition: high strength, excellent high-frequency characteristics, and a large thermal expansion coefficient.

In the insulating ceramic composition, 15% by weight or less of the spinel is preferably replaced with the $Mg_2SiO_4$ with respect to 100% by weight of the spinel. When the substitutional rate exceeds 15% by weight, the flexural strength becomes excessively large.

A dense sintered body (namely, an insulating ceramic) can be obtained by firing the first or second insulating ceramic composition at, particularly, 1000° C. or less. These insulating ceramic compositions can be fired together with low-melting metal materials such as copper and silver having a small resistivity to provide ceramic multilayer substrates and ceramic electronic components including conductive wires which have a large conductivity and are suitable for use at high frequencies.

The glass powder in the first or second insulating ceramic composition of the present invention must contain 30–60% by mole of silicon oxide on the basis of $SiO_2$. When the $SiO_2$ content is less than 30% by mole, the crystallinity of a sintered insulating ceramic is lowered to decrease the Q-factor. In contrast, when the $SiO_2$ content is more than 60% by mole, the melting point of formed glass is increased and therefore the low-temperature sintering is not possible.

Furthermore, the glass powder must contain 20–55% by mole of magnesium oxide on the basis of MgO. MgO has a function of reducing the softening point of glass and therefore the glass powder can be readily prepared. Since MgO is a crystal component of crystallized glass, an insulating ceramic produced by firing the insulating ceramic composition has a precipitated crystal phase such as an MgO—$SiO_2$ phase or an MgO—CaO—$SiO_2$ phase including the following MgO phase: forsterite, enstatite, diopside, and monticellite. The insulating ceramic having such a crystal phase has a Qf value of several ten thousands GHz, that is, an excellent high-frequency characteristic. When the content of MgO in the glass powder is less than 20% by mole, an obtained insulating ceramic has a small Q-factor. In contrast, when the content of MgO is more than 55% by mole, the quantity of the precipitating MgO crystal phase becomes excessively large. Therefore, an obtained insulating ceramic has low strength and the low temperature sintering is not possible.

The glass powder preferably further contains 20% by mole or less of boron oxide on the basis of $B_2O_3$. Since $B_2O_3$ functions as a fusing agent in the step of preparing the glass powder, the glass powder containing $B_2O_3$ can be readily obtained. When the content of $B_2O_3$ exceeds 20% by mole, an obtained insulating ceramic has inferior moisture resistance and weak elution resistance to a plating solution in some cases.

The glass powder preferably further contains 30% by mole or less of at least one oxide selected from the group consisting of CaO, SrO, BaO, and ZnO. These alkaline-earth metal oxides have a function of lowering the softening point of glass and therefore the glass powder containing these oxides can be readily prepared. Since the oxides are crystal components of crystallized glass, an obtained insulating ceramic has a precipitated crystal phase with a large Q-factor. When the content of the oxides in the glass powder exceeds 30% by mole, an obtained insulating ceramic has weak elution resistance to a plating solution and a small Q-factor in some cases.

The glass powder preferably further contains 10% by mole or less of aluminum oxide on the basis of $Al_2O_3$. $Al_2O_3$ has a function of improving the chemical stability of glass. When the content of $Al_2O_3$ exceeds 10% by mole, an obtained insulating ceramic has a small Q-factor and a small thermal expansion coefficient in some cases.

The glass powder preferably further contains 10% by mole or less of at least one alkaline metal oxide selected from the group consisting of $Li_2O$, $K_2O$, and $Na_2O$ with respect to 100% by mass of the glass powder. These alkaline metal oxides have a function of lowering the softening point of glass. When the content of the alkaline metal oxide exceeds 10% by mole, an obtained insulating ceramic has a small Q-factor and weak elution resistance in some cases.

The glass powder contained in the first or second insulating ceramic composition may include a powder prepared by mixing some glass powders having different components and preferably includes another powder prepared by mixing some glass powders having different components to fire the mixture at 700–1400° C. to pulverize the resulting mixture.

The first and second insulating ceramic compositions preferably further contain 3% by weight or less of copper oxide on the basis of CuO. Copper oxide has a function of lowering the firing temperature of the first and second insulating ceramic compositions. When the content of CuO exceeds 3% by weight, the Q-factor is insufficient in some cases.

In the first and second insulating ceramic compositions, the ratio of the ceramic powder content to the glass powder content is preferably 20:80 to 80:20 on a weight basis. When the content of the ceramic powder exceeds the above ratio, an obtained insulating ceramic has a small density in some cases. When the content of the glass powder exceeds the above ratio, an obtained insulating ceramic has a small Q-factor in some cases.

According to the present invention, in the first insulating ceramic composition, part of $MgAl_2O_4$ in the glass powder may be replaced with $Mg_2SiO_4$. The second insulating ceramic composition may further contain titanium oxide. The quantity of replaced $MgAl_2O_4$ and the content of titanium oxide are as described above.

An insulating ceramic of the present invention is produced by firing the first or second insulating ceramic composition described above. Therefore, the insulating ceramic of the present invention has high strength and excellent high-frequency characteristics.

The insulating ceramic preferably has a Q-factor of 400 or more at a measuring frequency of 15 GHz particularly. An insulating ceramic composition of the present invention can provide an insulating ceramic having a Qf value of 6000 or more, wherein the Qf value is defined as the product of 15 GHz and the Q-factor. Therefore, the insulating ceramic composition can provide ceramic multilayer substrates suitable for use at high frequencies.

A ceramic multilayer substrate of the present invention includes a plurality of ceramic layers and a conductive wire disposed on at least one of the plurality of ceramic layers, wherein the plurality of ceramic layers include an insulating ceramic layer comprising an insulating ceramic of the present invention.

In the ceramic multilayer substrate, the plurality of ceramic layers preferably further includes a dielectric ceramic layer that is disposed on at least one principal face of the insulating ceramic layer and has a dielectric constant higher than that of the insulating ceramic layer. That is, the ceramic multilayer substrate includes ceramic multilayer substrates having an insulating layer comprising the insulating ceramic of the present invention and composite ceramic multilayer substrates having an insulating layer comprising the insulating ceramic of the present invention and a dielectric layer comprising a dielectric ceramic with a dielectric constant larger than that of the insulating ceramic.

A ceramic electronic component of the present invention has the ceramic multilayer substrate of the present invention and a circuit element that is mounted on the ceramic multilayer substrate and is electrically connected to the conductive wire. The ceramic electronic component includes module components including the ceramic multilayer substrate having active elements such as semiconductor devices and having passive elements such as chip capacitors thereon.

A ceramic electronic component of the present invention may have the ceramic multilayer substrate of the present invention and a conductive wire connected to at least one of an inductor and a capacitor. The ceramic electronic component of the present invention includes chip components such as multilayer LC filters including the ceramic multilayer substrate having inductors and capacitors.

These ceramic electronic components of the present invention preferably includes a ceramic element comprising the insulating ceramic and a conductor wire having internal electrodes disposed in the ceramic element and external electrodes disposed on the ceramic element and electrically connected to the internal electrodes. The ceramic element preferably includes a plurality of ceramic layers, and a ceramic layer is preferably placed between an internal electrode connected to a component having a potential and another internal electrode connected to a component having another potential among the internal electrodes to form a capacitor. In the ceramic electronic components, the internal electrodes may be connected to each other to form an inductor.

A method for manufacturing a ceramic multilayer substrate according to the present invention includes the steps of layering first green ceramic sheets comprising a first or second insulating ceramic composition to prepare a layered body, providing a second green ceramic sheet having a sintering temperature different from that of the first green ceramic sheets onto at least one principal face of the layered first green ceramic sheets, and firing the layered body including the first green ceramic sheets together with the second green ceramic sheet.

Preferably, the second green ceramic sheet is not substantially sintered at a temperature at which the first green ceramic sheets are sintered. The layered body including the first green ceramic sheets is preferably fired at 1000° C. or less together with the second green ceramic sheet. A ceramic powder contained in the second green ceramic sheet includes ceramics such as alumina, zirconia, and magnesia.

Next, with reference to the drawings, the embodiments of a ceramic electronic component according to the present invention will now be described.

Figure 1:
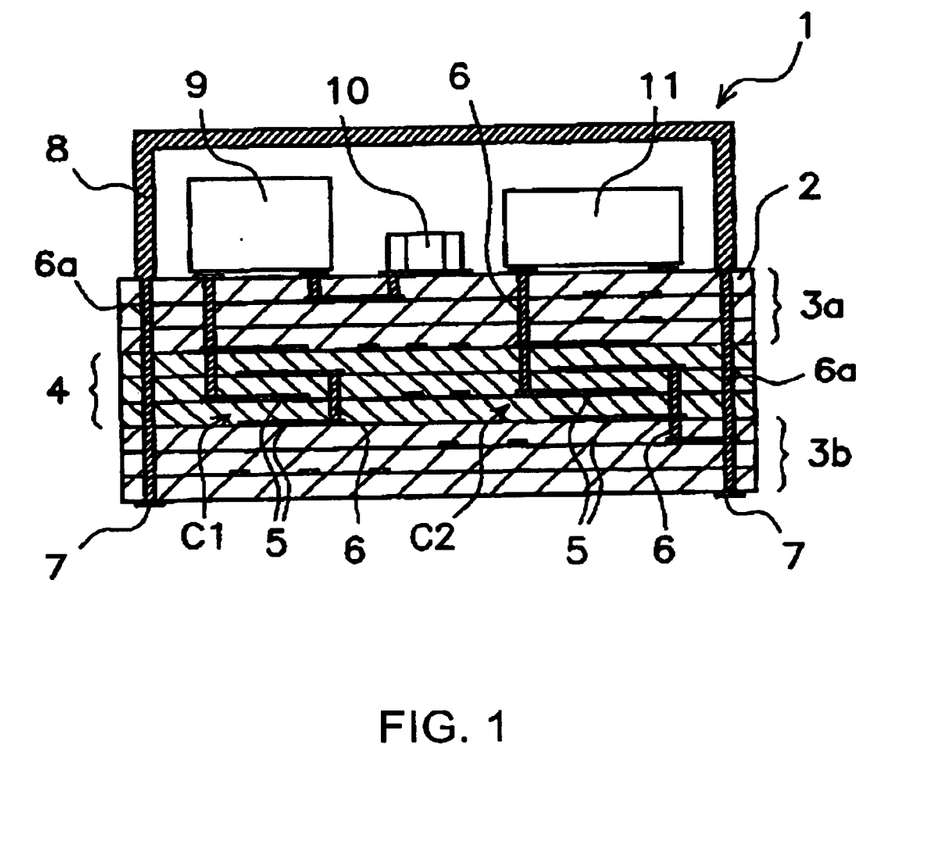
FIG. 1 is a vertical sectional view of a ceramic multilayer module which is a ceramic electronic component including a ceramic multilayer substrate according to the present invention.
Figure 2:
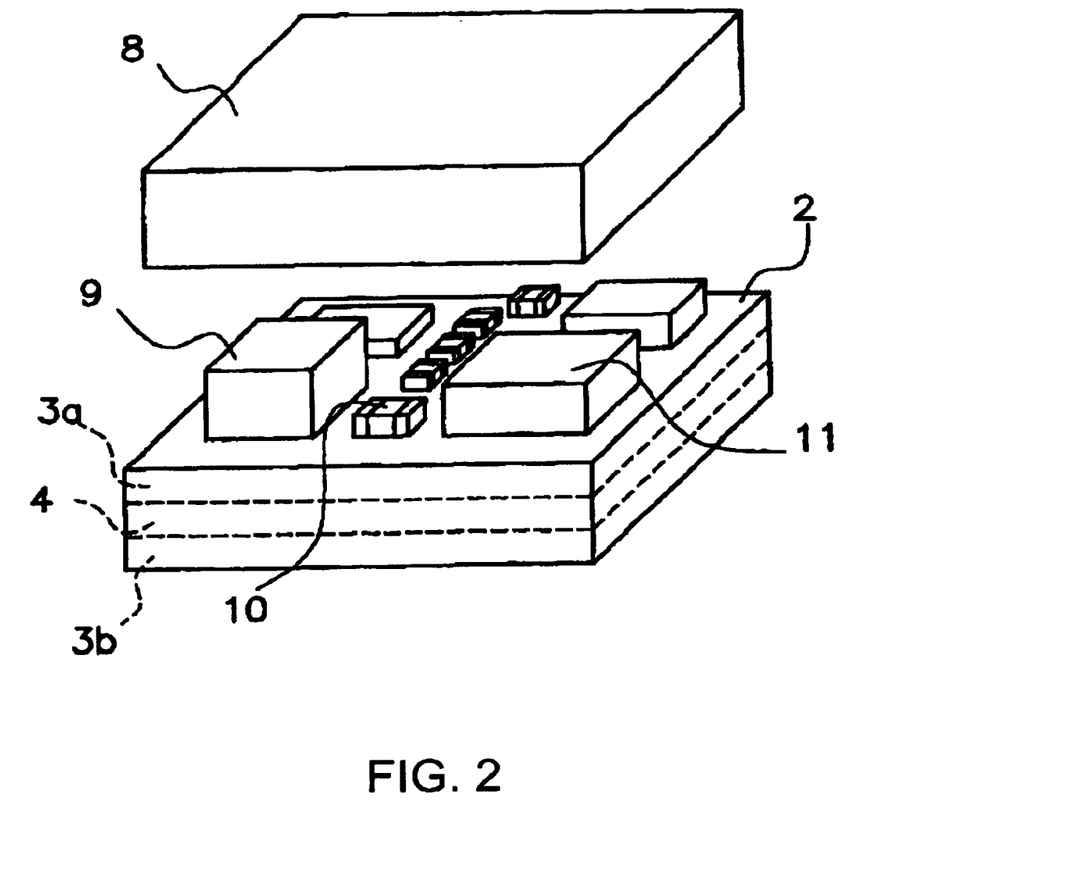
FIG. 2 is an exploded perspective view of the ceramic multilayer module shown in FIG. 1.

FIG. 1 is a sectional view of a ceramic multilayer module, which is a ceramic electronic component of the present invention, and FIG. 2 is a perspective view thereof.

The ceramic multilayer module 1 includes a ceramic multilayer substrate 2. The ceramic multilayer substrate 2 has a composite multilayer structure in which insulating ceramic layers 3a and 3b comprising an insulating ceramic of the present invention have a dielectric ceramic layer 4 therebetween, wherein the dielectric ceramic layer 4 comprises barium titanate and glass and has a relatively high dielectric constant.

The dielectric ceramic layer 4 has a plurality of internal electrodes 5 therein to form capacitors C1 and C2, wherein the plurality of internal electrodes 5 are each arranged between parts of the dielectric ceramic layer 4.

The insulating ceramic layers 3a and 3b and the dielectric ceramic layer 4 have a plurality of via-hole electrodes 6 and 6a and internal wires.

On the other hand, electronic component devices 9 to 11 are mounted on the ceramic multilayer substrate 2. The electronic component devices 9 to 11 include semiconductor devices, chip-type multilayer capacitors, and the like. These electronic component devices 9 to 11 are electrically connected to the capacitors C1 and C2 to form the electric circuit of the ceramic multilayer module 1.

The ceramic multilayer substrate 2 has a conductive cap 8 thereon in a fixed manner. The conductive cap 8 is electrically connected to the via-hole electrodes 6a extending from the upper face to the lower face of the ceramic multilayer substrate 2. External electrodes 7 are disposed on the lower face of the ceramic multilayer substrate 2 and are electrically connected to the via-hole electrodes 6 and 6a. Other external electrodes, which are not shown, are disposed on the ceramic multilayer substrate 2 in the same manner as in the external electrodes 7. These external electrodes are electrically connected to the electronic component devices 9 to 11 and the capacitors C1 and C2 with the above internal electrodes.

Since the external electrodes 7 are disposed on the lower face of the ceramic multilayer substrate 2, the ceramic multilayer module 1 can be readily mounted on a printed circuit board using the lower face.

In this embodiment, since the cap 8 comprises a conductive material and is electrically connected to the external electrodes 7 with the via-hole electrodes 6a, the electronic component devices 9 to 11 can be electromagnetically shielded with the cap 8. However, the conductive cap 8 does not necessarily comprise a conductive material.

Since the ceramic multilayer module 1 includes the insulating ceramic layers 3a and 3b comprising an insulating ceramic according to the present invention, the dielectric constant is small and the Q-factor is large at high frequencies and therefore the ceramic multilayer module 1 is suitable for high-frequency applications.

The ceramic multilayer substrate 2 can be readily manufactured by a conventional method for co-firing ceramic layers.

That is, green ceramic sheets, having a predetermined electrode pattern, for dielectric ceramic layers are prepared according to the following procedure: green ceramic sheets principally comprising a dielectric ceramic composition such as barium titanate are provided, and an electrode pattern for forming the internal electrodes 5, via-hole electrodes 6 and 6a, and the like is then printed thereon. Furthermore, other green ceramic sheets, having a predetermined electrode pattern, for insulating ceramic layers are prepared according to the following procedure: green ceramic sheets comprising an insulating ceramic composition of the present invention are provided, and an electrode pattern for forming the internal electrodes 5, via-hole electrodes 6 and 6a, and the like is then printed thereon.

A predetermined number of the green ceramic sheets for dielectric ceramic layers and the green ceramic sheets for insulating ceramic layers are stacked to form a layered body, and the layered body is then pressed in the thickness direction. The resulting green layered body is then fired at a predetermined temperature, thereby obtaining the ceramic multilayer substrate 2.

Figure 3:
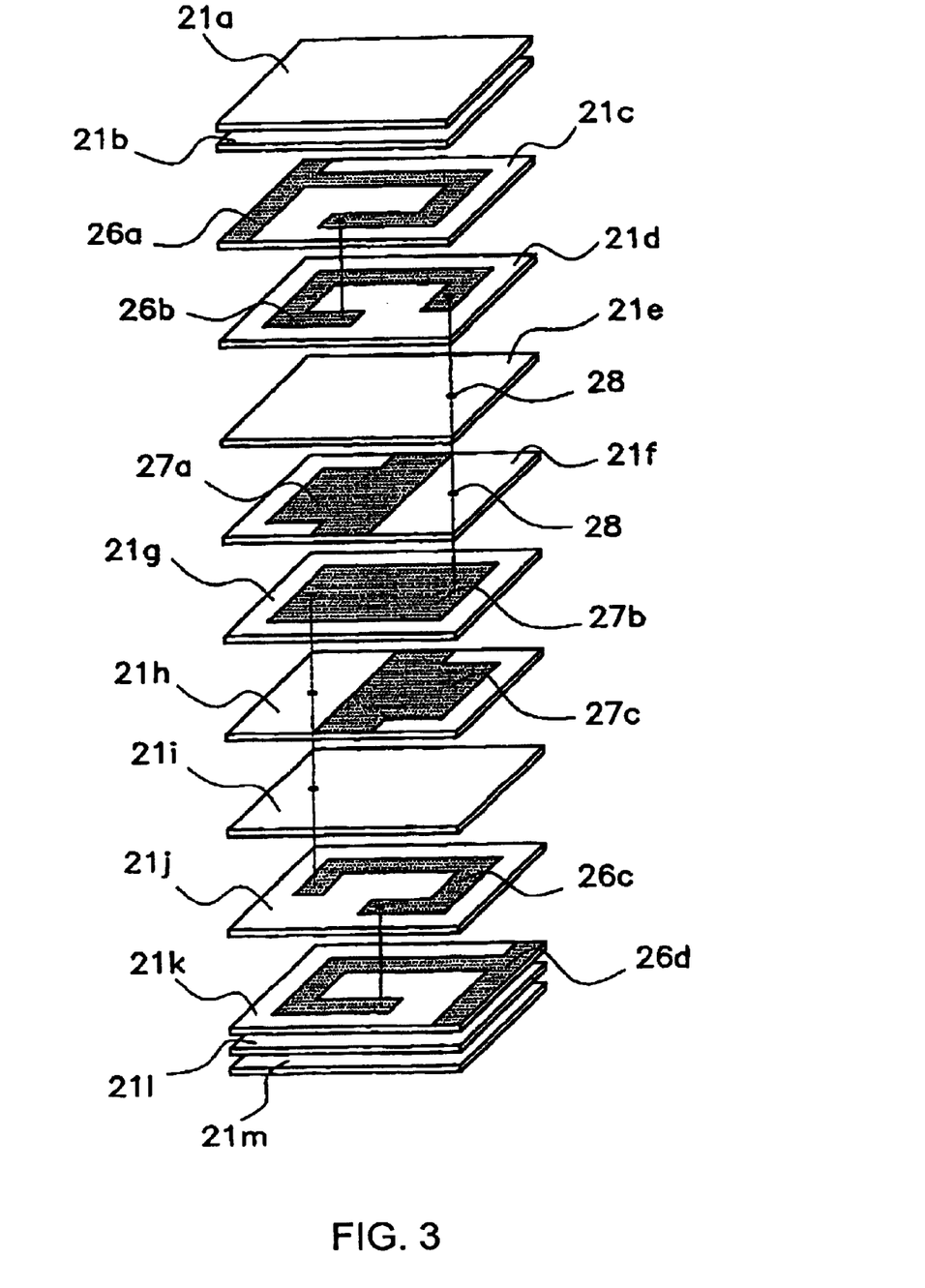
FIG. 3 is a vertical sectional view of a monolithic LC filter which is a ceramic electronic component including a ceramic multilayer substrate according to the present invention.
Figure 4:
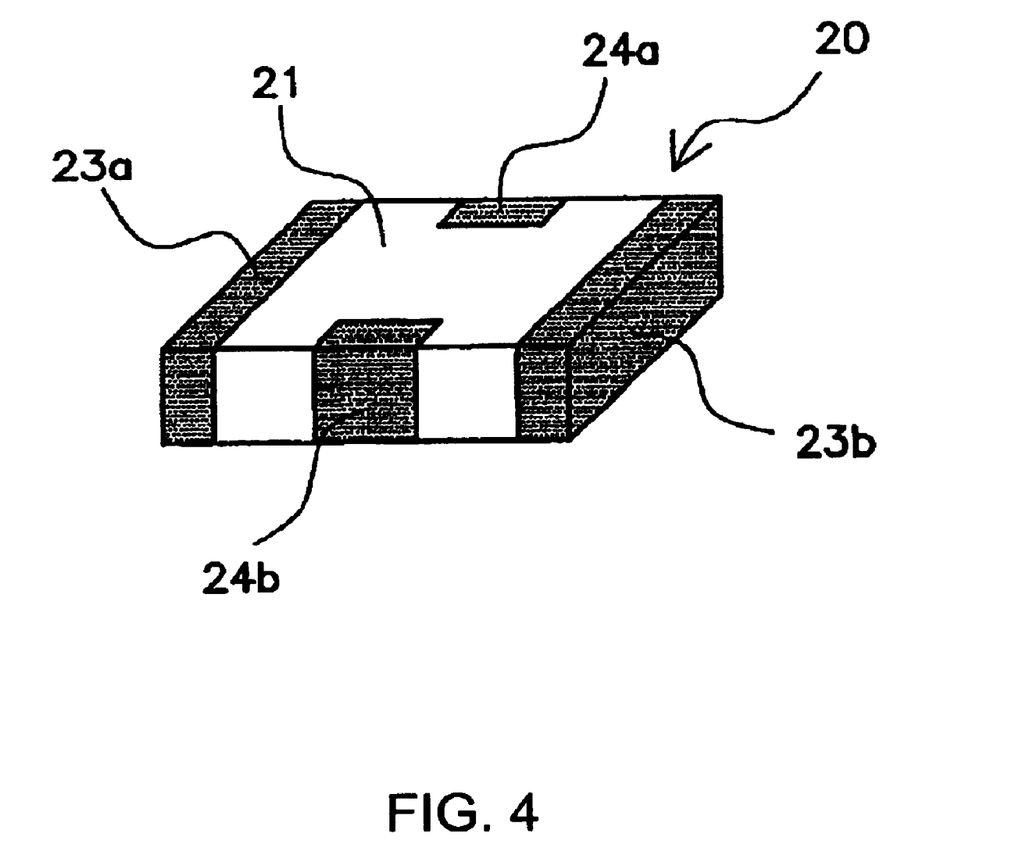
FIG. 4 is a perspective view of the monolithic LC filter shown in FIG. 2.
Figure 5:
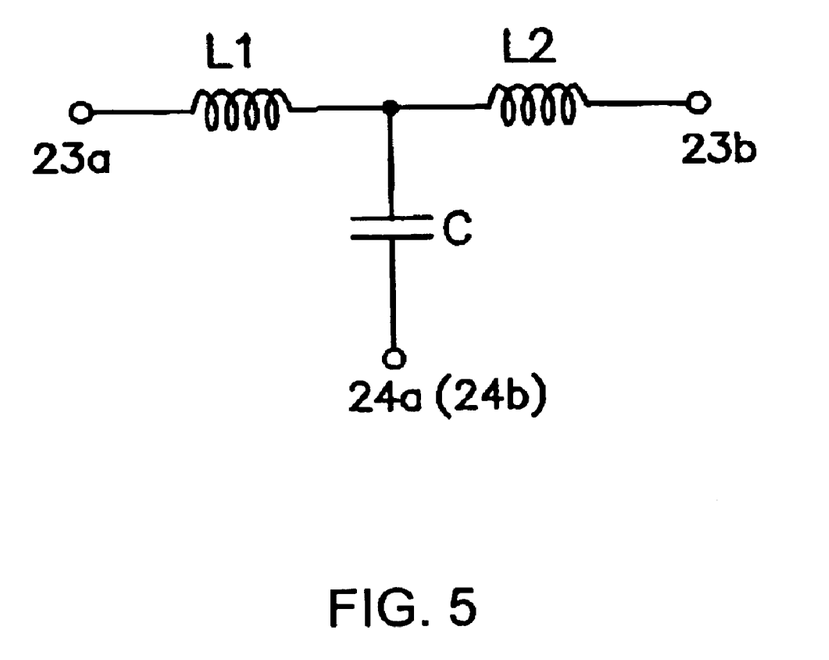
FIG. 5 is an illustration showing an equivalent circuit of the monolithic LC filter shown in FIG. 3.

FIGS. 3 to 5 are an exploded perspective view, a schematic perspective view, and a circuit diagram of a monolithic LC filter, respectively, which is a ceramic electronic component of the present invention.

A monolithic ceramic electronic component 20 shown in FIG. 4 is the monolithic LC filter. A ceramic sintered body 21 has a circuit including an inductor L and a capacitor C therein, as described below. The ceramic sintered body 21 comprises an insulating ceramic of the present invention. External electrodes 23a, 23b, 24a, and 24b are disposed on the ceramic sintered body 21, and an LC resonant circuit shown in FIG. 5 is placed among the external electrodes 23a, 23b, 24a, and 24b.

A method for manufacturing the ceramic sintered body 21 will be now described with reference to FIG. 3 to make the configuration thereof clear.

An organic vehicle is added to an insulating ceramic composition of the present invention to prepare a ceramic slurry. The resulting ceramic slurry is processed into green ceramic sheets by an ordinary sheet-forming method. The resulting green ceramic sheets are dried and then punched out to prepare rectangular green ceramic sheets 21a to 21m having a predetermined size.

Perforations for forming a via-hole electrode 28 are provided in the green ceramic sheets 21a to 21m depending on needs. Conductive paste is then provided thereon by a screen-printing process to form conductive coils 26a and 26b for an inductor L1, internal electrodes 27a to 27c for a capacitor C, and conductive coils 26c and 26d for another inductor L2, and is packed into the perforations to form the via-hole electrode 28.

Subsequently, the green ceramic sheets 21a to 21m are stacked in the direction shown in the figure and then pressed in the thickness direction to form a layered body. The resulting layered body is fired to provide the sintered body 21.

As shown in FIG. 4, the external electrodes 23a to 24b are provided on the resulting sintered body 21 by a thin-film forming process such as the application and the baking of conductive paste, vapor deposition, plating, or sputtering. The monolithic ceramic electronic component 20 is obtained in the above manner.

As shown in FIG. 3, the conductive coils 26a and 26b form the inductor L1 shown in FIG. 5, the conductive coils 26c and 26d form the inductor L2, and the internal electrodes 27a to 27c form the capacitor C.

In the monolithic ceramic electronic component 20 of this embodiment, the monolithic LC filter has the above configuration. Since the sintered body 21 comprises an insulating ceramic of the present invention, the sintered body 21 is sintered at a low temperature in the same manner as in the ceramic multilayer substrate 2 described above. Thus, the conductive pattern 26a to 26c and the electrode pattern 27a to 27c comprising a low-melting metal such as copper, silver, or gold can be fired together with an insulating ceramic composition. Since the monolithic LC filter includes a conductive material having a small resistivity and the insulating ceramic having a large Q-factor at high frequencies, the monolithic LC filter is suitable for use at high frequencies.

In the above embodiments, an exemplary ceramic multilayer module and monolithic LC filter are described. However, a ceramic electronic component of the present invention is not limited thereto. The present invention can be applied to the following components: various ceramic multilayer substrates such as ceramic multilayer substrates for multi-chip modules or for hybrid ICs, various ceramic electronic components including a ceramic multilayer substrate having electronic component devices thereon, and various chip-type monolithic electronic components such as chip-type monolithic capacitors and chip-type monolithic dielectric antennas.

EXAMPLE

The present invention will now be described in detail with reference to the particular examples.

Example 1

An $Mg(OH)_2$ powder and an $Al_2O_3$ powder, which are raw materials, were weighed so as to form a stoichiometric composition corresponding to $MgAl_2O_4$ and wet-mixed for 16 hours, and the mixture was dried. The dried mixture was fired at 1350° C. for 2 hours and then crushed. The obtained powder was mixed together with a commercially available $TiO_2$ powder to prepare a ceramic powder.

In order to obtain glass powders having compositions shown in Table 1, raw material powders were mixed in a predetermined ratio to form mixtures, and the mixtures were fired at 700–1400° C. and then crushed to prepare the glass powders having the compositions G1 to G40 shown in Table 1.

The ceramic powder and the glass powders were compounded in the ratios shown in Tables 2 and 3. A solvent, CuO, a binder, and a plasticizer were added to these compounds to prepare slurry samples S1 to S51. The slurry samples were formed into first green ceramic sheets having a thickness of 50 μm by a doctor blade method.

Twenty four of the first green ceramic sheets were stacked and then pressed with a pressure of 2000 kg/cm² to form a cylindrical green layered body having a diameter of 12 mm and a thickness of 7 mm.

Apart from the layered body including the first green ceramic sheets, a commercially available aluminum powder that is not sintered at 1000° C. or less was provided for the ceramic powder. The aluminum powder was mixed together with a solvent, a binder, and a plasticizer to form a second slurry. The second slurry was formed into a second green ceramic sheet having a thickness of 50 μm by a doctor blade method.

The resulting second green ceramic sheet was cut into pieces having a length of 30 mm and a width of 10 mm. Each second green ceramic sheet piece was placed on both end faces of the layered body, having the first green ceramic sheets, in the layered direction to press them to form a lamination. The lamination, in which the layered body including the first green ceramic sheets was sandwiched between the second green ceramic sheet pieces, was fired at 900–1000° C. for 2 hours in atmosphere in such a manner that the layered body including the first green ceramic sheets was sandwiched between the second green ceramic sheet pieces in the layered direction, thereby obtaining a sintered body including the first green ceramic sheets. Subsequently, the second green ceramic sheet pieces, which were not sintered, were removed to provide insulating ceramic samples.

For the insulating ceramic samples, the dielectric constant or and the Q-factor were measured at 15 GHz by a dielectric resonator method short-circuited at both ends of a dielectric resonator. Furthermore, the thermal expansion coefficient and the difference in dimension of the insulating ceramic samples were measured.

Separately, the first green ceramic sheets were punched out into pieces having a predetermined size. Ag conductive paste was provided on the pieces by a screen printing method to form internal electrodes for capacitors. The resulting pieces were stacked and then pressed to form a layered body. The layered body was fired at 900–1000° C. to provide a ceramic sintered body. Conductive paste was applied onto the ceramic sintered body and baked to form external electrodes. Monolithic capacitors comprising insulating ceramics having the composition shown in Tables 2 and 3 were obtained in the above manner.

A voltage of 50 V was applied to the monolithic capacitors, and the resulting monolithic capacitors were left in the following conditions for 2 hours: a temperature of 120° C., a relative humidity of 95%, and a pressure of 2 atm. The change in insulation resistance (TCC) before and after the high-temperature and high-humidity test was measured to evaluate the moisture resistance. The results are shown in Tables 2 and 3.

Sample S0 in Table 2 was prepared by firing the layered body including the first green ceramic sheets and not including the second green ceramic sheet pieces.

In the following Table 1, the contents (percent by weight) of $Li_2O$, NaO, and $K_2O$ are represented with a percentage with respect to the total amount, 100% by weight, of other glass components.

TABLE 1

| | $SiO_2$ (mol %) | MgO (mol %) | $B_2O_3$ (mol %) | CaO (mol %) | SrO (mol %) | BaO (mol %) | ZnO (mol %) | $Al_2O_3$ (mol %) | $Li_2O$ (wt %) | $K_2O$ (wt %) | $Na_2O$ (wt %) |
|---|---|---|---|---|---|---|---|---|---|---|---|
| G1 | 45 | 55 | — | — | — | — | — | — | — | — | — |
| G2 | 50 | 50 | — | — | — | — | — | — | — | — | — |
| G3 | 30 | 55 | 15 | — | — | — | — | — | — | — | — |
| G4 | 60 | 30 | 10 | — | — | — | — | — | — | — | — |
| G5 | 50 | 40 | 10 | — | — | — | — | — | — | — | — |
| G6 | 50 | 30 | 20 | — | — | — | — | — | — | — | — |
| G7 | 30 | 50 | — | 20 | — | — | — | — | — | — | — |
| G8 | 50 | 20 | — | — | 30 | — | — | — | — | — | — |
| G9 | 30 | 45 | 20 | — | — | — | — | 5 | — | — | — |
| G10 | 35 | 40 | 10 | 5 | 5 | — | — | 5 | — | — | — |
| G11 | 45 | 50 | 5 | — | — | — | — | — | 5 | — | — |
| G12 | 50 | 40 | — | — | — | — | — | 10 | 10 | — | — |
| G13 | 40 | 50 | — | — | — | — | — | 10 | 10 | — | — |
| G14 | 45 | 40 | 5 | 10 | — | — | — | — | 5 | — | — |
| G15 | 45 | 20 | 5 | — | 10 | 20 | — | — | 5 | — | — |
| G16 | 35 | 30 | 20 | — | — | — | 15 | — | 5 | — | 5 |
| G17 | 40 | 50 | 10 | — | — | — | — | — | 5 | 5 | — |
| G18 | 35 | 45 | 5 | 15 | — | — | — | — | 5 | — | — |
| G19 | 35 | 25 | 10 | — | — | 30 | — | — | 5 | — | — |
| G20 | 30 | 45 | 15 | — | — | 5 | 5 | — | 5 | 5 | — |
| G21 | 45 | 25 | 5 | 5 | — | 5 | 5 | 10 | 10 | — | — |
| G22 | 35 | 24 | 21 | — | — | — | 20 | — | 5 | — | — |
| G23 | 39 | 20 | 21 | — | — | — | 20 | — | 4 | — | — |
| G24 | 34 | 45 | 21 | — | — | — | — | — | — | — | — |
| G25 | 40 | 20 | 9 | — | 10 | 21 | — | — | 5 | — | — |
| G26 | 30 | 30 | — | 30 | 5 | — | — | 5 | — | — | — |
| G27 | 34 | 20 | 10 | 31 | — | 5 | — | — | 4 | — | — |
| G28 | 30 | 20 | 19 | — | — | 31 | — | — | 5 | — | — |
| G29 | 45 | 24 | — | — | 31 | — | — | — | — | — | — |
| G30 | 49 | 40 | — | — | — | — | — | 11 | 10 | — | — |
| G31 | 35 | 30 | 10 | — | 4 | — | 10 | 11 | — | — | — |
| G32 | 40 | 39 | 10 | — | — | — | — | 11 | — | — | — |
| G33 | 40 | 30 | 10 | 10 | — | 5 | 5 | — | 11 | — | — |
| G34 | 35 | 40 | 10 | 5 | — | 5 | 5 | — | 11 | — | — |
| G35 | 29 | 55 | 16 | — | — | — | — | — | — | — | — |
| G36 | 51 | 34 | 15 | — | — | — | — | — | — | — | — |
| G37 | 61 | 34 | 5 | — | — | — | — | — | — | — | — |
| G38 | 41 | 19 | 10 | 30 | — | — | — | — | 6 | — | — |
| G39 | 41 | 19 | 20 | 20 | — | — | — | — | 6 | — | — |
| G40 | 30 | 56 | 14 | — | — | — | — | — | — | — | — |

TABLE 2

| | Ceramic Powder | | Glass | | CuO (wt %) | Firing Temp. (° C.) | TEC*1 (ppm deg$^{-1}$) | | TCC (ppm deg$^{-1}$) | Q | DID*2 (%) |
|---|---|---|---|---|---|---|---|---|---|---|---|
| | $MgAl_2O_4$ (wt %) | $TiO_2$ (wt %) | Powder (wt %) | Type | | | | εr | | | |
| S0 | 35 | 5 | 60 | G3 | 3 | 900 | 9.8 | 6.9 | +45 | 700 | 0.5 |
| S1 | 35 | 0 | 65 | G3 | 0 | 900 | 10.2 | 6.9 | +120 | 400 | 0.1 (−)*3 |
| S2 | 35 | 5 | 60 | G3 | 3 | 900 | 9.9 | 7.0 | +45 | 730 | 0.1 (−)*3 |
| S3 | 15 | 5 | 80 | G18 | 3 | 900 | 9.9 | 7.0 | +60 | 460 | 0.1 (−)*3 |
| S4 | 15 | 5 | 80 | C18 | 4 | 900 | 10.2 | 7.0 | — | 160 | 0.1 (−)*3 |

TABLE 2-continued

|  | Ceramic Powder | | Glass | | Firing | TEC*1 | | TCC | | DID*2 |
|  | MgAl₂O₄ | TiO₂ | Powder | | CuO | Temp. | (ppm | | (ppm | | |
|  | (wt %) | (wt %) | (wt %) | Type | (wt %) | (° C.) | deg⁻¹) | εr | deg⁻¹) | Q | (%) |
|---|---|---|---|---|---|---|---|---|---|---|---|
| S5  | 15 | 5 | 80 | G13 | 3 | 900  | 10.6 | 7.0 | +50 | 460 | 0.1 (−)*3 |
| S6  | 15 | 5 | 80 | G5  | 3 | 900  | 9.8  | 7.0 | +50 | 420 | 0.1 (−)*3 |
| S7  | 5  | 5 | 90 | G5  | 3 | 900  | 9.6  | 6.8 | +55 | 400 | 0.1 (−)*3 |
| S8  | 45 | 5 | 50 | G19 | 0 | 900  | 10.3 | 7.0 | +20 | 850 | 0.1 (−)*3 |
| S9  | 45 | 5 | 50 | G19 | 1 | 900  | 10.4 | 7.0 | +5  | 880 | 0.1 (−)*3 |
| S10 | 55 | 5 | 40 | G19 | 0 | 900  | 10.1 | 7.1 | −5  | 460 | 0.1 (−)*3 |
| S11 | 75 | 5 | 20 | G19 | 3 | 1000 | 10.5 | 7.0 | −10 | 410 | 0.1 (−)*3 |
| S12 | 85 | 5 | 10 | G19 | 0 | 1000 | 10.6 | 7.1 | +10 | 400 | 0.1 (−)*3 |
| S13 | 45 | 5 | 50 | G26 | 1 | 900  | 10.2 | 7.1 | +10 | 660 | 0.1 (−)*3 |
| S14 | 35 | 5 | 60 | G26 | 2 | 900  | 9.9  | 6.9 | +20 | 720 | 0.1 (−)*3 |
| S15 | 35 | 5 | 60 | G20 | 0 | 900  | 10.3 | 7.1 | +15 | 750 | 0.1 (−)*3 |
| S16 | 65 | 5 | 30 | G20 | 3 | 1000 | 10.7 | 7.3 | −20 | 420 | 0.1 (−)*3 |
| S17 | 35 | 5 | 60 | G20 | 3 | 900  | 10.3 | 7.0 | +5  | 830 | 0.1 (−)*3 |
| S18 | 25 | 5 | 70 | G20 | 1 | 900  | 10.5 | 6.9 | +40 | 730 | 0.1 (−)*3 |
| S19 | 65 | 5 | 30 | G17 | 3 | 1000 | 10.3 | 7.2 | −10 | 400 | 0.1 (−)*3 |
| S20 | 55 | 5 | 40 | G17 | 1 | 900  | 10.4 | 7.1 | +5  | 450 | 0.1 (−)*3 |
| S21 | 45 | 5 | 50 | G17 | 0 | 900  | 10.6 | 6.9 | +10 | 550 | 0.1 (−)*3 |
| S22 | 35 | 5 | 60 | G17 | 0 | 900  | 10.7 | 6.9 | +20 | 650 | 0.1 (−)*3 |

*1TEC represents the term thermal expansion coefficient.
*2DID represents the term difference in dimension.
*3 0.1 (−) means 0.1 or less.

TABLE 3

|  | Ceramic Powder | | Glass | | Firing | TEC*1 | | TCC | | DID*2 |
|  | MgAl₂O₄ | TiO₂ | Powder | | CuO | Temp. | (ppm | | (ppm | | |
|  | (wt %) | (wt %) | (wt %) | Type | (wt %) | (° C.) | deg⁻¹) | εr | deg⁻¹) | Q | (%) |
|---|---|---|---|---|---|---|---|---|---|---|---|
| S23 | 35 | 5  | 60 | G35 | 3 | 900  | 10.3 | 6.9 | —   | 310 | 0.1 (−)*3 |
| S24 | 35 | 5  | 60 | G35 | 0 | 1000 | 9.8  | 6.9 | +30 | 20  | 0.1 (−)*3 |
| S25 | 35 | 5  | 60 | G35 | 3 | 1000 | 9.9  | 7.0 | +50 | 40  | 0.1 (−)*3 |
| S26 | 35 | 5  | 60 | G40 | 0 | 1000 | —    | —   | —   | —   | 0.1 (−)*3 |
| S27 | 35 | 5  | 60 | G40 | 3 | 1000 | —    | —   | —   | —   | 0.1 (−)*3 |
| S28 | 45 | 5  | 50 | G23 | 1 | 900  | 10.3 | 7.0 | —   | 300 | 0.1 (−)*3 |
| S29 | 55 | 5  | 40 | G23 | 0 | 900  | 9.6  | 7.1 | —   | 150 | 0.1 (−)*3 |
| S30 | 75 | 5  | 20 | G23 | 3 | 900  | 10.5 | 7.0 | —   | 260 | 0.1 (−)*3 |
| S31 | 15 | 5  | 80 | G36 | 3 | 900  | 9.8  | 7.0 | +70 | 120 | 0.1 (−)*3 |
| S32 | 45 | 5  | 50 | G39 | 0 | 900  | 10.3 | 7.0 | +90 | 80  | 0.1 (−)*3 |
| S33 | 15 | 5  | 80 | G31 | 3 | 900  | 10.6 | 7.0 | +80 | 50  | 0.1 (−)*3 |
| S34 | 15 | 5  | 80 | G28 | 3 | 900  | 10.7 | 7.0 | +60 | 40  | 0.1 (−)*3 |
| S35 | 35 | 5  | 60 | G27 | 3 | 900  | 10.6 | 6.9 | —   | 650 | 0.1 (−)*3 |
| S36 | 35 | 1  | 64 | G1  | 2 | 900  | 9.8  | 6.8 | +40 | 450 | 0.1 (−)*3 |
| S37 | 34 | 2  | 64 | G1  | 2 | 900  | 9.8  | 6.8 | +35 | 480 | 0.1 (−)*3 |
| S38 | 32 | 4  | 64 | G1  | 2 | 900  | 9.9  | 6.9 | +30 | 580 | 0.1 (−)*3 |
| S39 | 31 | 5  | 64 | G1  | 2 | 900  | 10.0 | 7.0 | +20 | 700 | 0.1 (−)*3 |
| S40 | 28 | 8  | 64 | G1  | 2 | 900  | 10.4 | 7.2 | +10 | 500 | 0.1 (−)*3 |
| S41 | 26 | 10 | 64 | G1  | 2 | 900  | 10.6 | 7.3 | −5  | 450 | 0.1 (−)*3 |
| S42 | 24 | 12 | 64 | G1  | 2 | 900  | 10.7 | 7.4 | −15 | 400 | 0.1 (−)*3 |
| S43 | 21 | 15 | 64 | G1  | 2 | 900  | 11.2 | 7.6 | −30 | 400 | 0.1 (−)*3 |
| S44 | 35 | 5  | 60 | G2  | 1 | 900  | 10.0 | 7.2 | +10 | 750 | 0.1 (−)*3 |
| S45 | 40 | 5  | 55 | G6  | 2 | 900  | 10.1 | 6.7 | +20 | 660 | 0.1 (−)*3 |
| S46 | 30 | 10 | 60 | G7  | 3 | 900  | 9.8  | 7.1 | −25 | 700 | 0.1 (−)*3 |
| S47 | 35 | 5  | 60 | G8  | 3 | 900  | 9.9  | 7.2 | +15 | 580 | 0.1 (−)*3 |
| S48 | 20 | 1  | 80 | G9  | 3 | 900  | 9.6  | 7.4 | +80 | 470 | 0.1 (−)*3 |
| S49 | 35 | 5  | 60 | G24 | 3 | 900  | 9.8  | 7.0 | —   | 220 | 0.1 (−)*3 |
| S50 | 35 | 5  | 60 | G29 | 3 | 900  | 9.9  | 7.1 | —   | 340 | 0.1 (−)*3 |
| S51 | 35 | 5  | 60 | G32 | 3 | 900  | —    | —   | —   | —   | 0.1 (−)*3 |

*1TEC represents the term thermal expansion coefficient.
*2DID represents the term difference in dimension.
*3 0.1 (−) means 0.1 or less.

Example 2

An Mg(OH)₂ powder and an Al₂O₃ powder, which are raw materials, were weighed so as to form a stoichiometric composition corresponding to MgAl₂O₄ and wet-mixed for 16 hours, and the mixture was dried. The dried mixture was fired at 1350° C. for 2 hours and then crushed. The ceramic powder obtained by the crushing was mixed together with glass powders comprising the above compositions G1 to G40 in the ratios shown in the following Table 4, and CuO was added to the mixed powders depending on needs. A solvent, a binder, and a plasticizer were added to the mixed powders to prepare slurry samples T1 to T29. The slurry samples were formed into green ceramic sheets having a thickness of 50 μm by a doctor blade method.

Apart from the above green ceramic sheets, the second green ceramic sheets used in Example 1 were separately prepared.

In the same way as in Example 1, insulating ceramic samples were prepared and then evaluated. In this embodiment, the change in insulation resistance before and after a high-humidity test was not evaluated and the flexural strength of the insulating ceramic samples was measured.

Sample T0 was prepared by firing a layered body comprising the first green ceramic sheets without using the second green sheets. The results are shown in the following Table 4.

ceramic multilayer substrates having excellent high-frequency characteristics and high mechanical strength can be manufactured.

Since the insulating ceramic compositions according to the second embodiment include the $MgAl_2O_4$ ceramic powder of which part is replaced with $Mg_2SiO_4$ and the glass powders comprising the above particular compositions, insulating ceramics obtained by firing the insulating ceramic compositions have high mechanical strength, a large thermal expansion coefficient, and a large Q-factor at high frequencies. Thus, ceramic multilayer substrates having excellent high-frequency characteristics, high mechanical strength, and a large thermal expansion coefficient can be manufactured.

TABLE 4

|  | Ceramic Powder | | Glass | | | Firing | TEC*1 | | Flexural | | |
|  | $MgAl_2O_4$ | $Mg_2SiO_4$ | Powder | | CuO | Temp. | (ppm | | Strength | | DID*2 |
|  | (wt %) | (wt %) | (wt %) | Type | (wt %) | (° C.) | $deg^{-1}$) | εr | (MPa) | Q | (%) |
| --- | --- | --- | --- | --- | --- | --- | --- | --- | --- | --- | --- |
| T0 | 38 | 2 | 60 | G3 | 3 | 900 | 9.7 | 7.0 | 230 | 460 | 0.5 |
| T1 | 38 | 2 | 60 | G3 | 3 | 900 | 9.8 | 7.0 | 230 | 450 | 0.1 (−)*3 |
| T2 | 35 | 5 | 60 | G3 | 3 | 900 | 10.0 | 7.1 | 210 | 480 | 0.1 (−)*3 |
| T3 | 34 | 6 | 60 | G3 | 3 | 900 | 10.2 | 7.1 | 190 | 500 | 0.1 (−)*3 |
| T4 | 20 | 0 | 80 | G14 | 3 | 900 | 9.7 | 7.0 | 210 | 480 | 0.1 (−)*3 |
| T5 | 18 | 2 | 80 | G14 | 3 | 900 | 9.7 | 7.0 | 200 | 520 | 0.1 (−)*3 |
| T10 | 50 | 0 | 50 | G15 | 0 | 900 | 10.0 | 7.0 | 250 | 550 | 0.1 (−)*3 |
| T11 | 50 | 0 | 50 | G15 | 1 | 900 | 10.0 | 7.0 | 260 | 580 | 0.1 (−)*3 |
| T12 | 60 | 0 | 40 | G15 | 0 | 900 | 9.9 | 7.1 | 255 | 550 | 0.1 (−)*3 |
| T13 | 80 | 0 | 20 | G15 | 3 | 1000 | 10.2 | 7.0 | 265 | 580 | 0.1 (−)*3 |
| T14 | 90 | 0 | 10 | G15 | 0 | 1000 | 10.3 | 6.9 | 230 | 500 | 0.1 (−)*3 |
| T15 | 45 | 5 | 50 | G15 | 0 | 900 | 10.1 | 7.1 | 220 | 600 | 0.1 (−)*3 |
| T16 | 40 | 10 | 50 | G15 | 0 | 900 | 10.0 | 7.0 | 180 | 650 | 0.1 (−)*3 |
| T17 | 35 | 5 | 60 | G4 | 3 | 900 | 10.1 | 7.2 | 220 | 460 | 0.1 (−)*3 |
| T18 | 35 | 5 | 60 | G10 | 3 | 900 | 10.4 | 7.0 | 190 | 530 | 0.1 (−)*3 |
| T19 | 35 | 5 | 60 | G11 | 3 | 900 | 9.8 | 7.0 | 190 | 500 | 0.1 (−)*3 |
| T20 | 35 | 5 | 60 | G12 | 3 | 900 | 9.7 | 7.1 | 200 | 520 | 0.1 (−)*3 |
| T21 | 35 | 5 | 60 | G16 | 3 | 900 | 10.0 | 7.0 | 210 | 320 | 0.1 (−)*3 |
| T22 | 35 | 5 | 60 | G21 | 3 | 900 | 10.4 | 7.3 | 180 | 420 | 0.1 (−)*3 |
| T23 | 35 | 5 | 60 | G22 | 3 | 900 | 10.2 | 7.3 | 200 | 490 | 0.1 (−)*3 |
| T24 | 35 | 5 | 60 | G25 | 3 | 900 | 10.8 | 7.6 | 230 | 510 | 0.1 (−)*3 |
| T25 | 35 | 5 | 60 | G30 | 3 | 900 | 10.5 | 7.3 | 245 | 390 | 0.1 (−)*3 |
| T26 | 35 | 5 | 60 | G33 | 3 | 900 | 10.2 | 7.1 | 230 | 300 | 0.1 (−)*3 |
| T27 | 35 | 5 | 60 | G34 | 3 | 900 | 10.3 | 7.1 | 195 | 450 | 0.1 (−)*3 |
| T28 | 35 | 5 | 60 | G37 | 3 | 900 | 10.2 | 6.6 | 80 | 320 | 0.1 (−)*3 |
| T29 | 35 | 5 | 60 | G38 | 3 | 900 | 10.9 | 8.0 | 205 | 60 | 0.1 (−)*3 |

*1TEC represents the term thermal expansion coefficient.
*2DID represents the term difference in dimension.
*3 0.1 (−) means 0.1 or less.

According to the above embodiments, since the insulating ceramic compositions of the embodiments include a $MgAl_2O_4$ ceramic powder and glass powders comprising the above particular compositions, the insulating ceramic compositions can be fired at a low temperature of 1000° C. or less. Thus, the insulating ceramic compositions can be fired together with a conductive material comprising a low-melting metal such as silver and copper and such a conductive material can be used for internal electrodes, thereby achieving ceramic multilayer substrates having excellent high-frequency characteristics.

In particular, since the insulating ceramic compositions according to the first embodiment include the $MgAl_2O_4$ ceramic powder containing titanium oxide ($TiO_2$) and the glass powders comprising the above particular compositions, insulating ceramics obtained by firing the insulating ceramic compositions have high mechanical strength and a large Q-factor at high frequencies. Thus,

INDUSTRIAL APPLICIABILTY

According to the present invention, ceramic electronic components having high mechanical strength and excellent high-frequency characteristics can be achieved.

What is claimed is:

1. An insulating ceramic composition comprising a ceramic powder comprising spinel ($MgAl_2O_4$), a glass powder comprising 30–60% by mole of silicon oxide on the basis of $SiO_2$ and 20–55% by mole of magnesium oxide on the basis of MgO, and wherein the composition contains titanium oxide or the ceramic contains $Mg_2SiO_4$.

2. An insulating ceramic composition according to claim 1, wherein the ceramic powder comprisies spinel ($MgAl_2O_4$) and $Mg_2SiO_4$.

3. The insulating ceramic composition according to claim 2, wherein the $Mg_2SiO_4$ is 15% by weight or less of the combined weight of the spinel and the $Mg_2SiO_4$.

4. The insulating ceramic composition according to claim 2, wherein the glass powder further contains 20% by mole or less of boron oxide on the basis of $B_2O_3$.

5. The insulating ceramic composition according to claim 2, wherein the glass powder further contains 30% by mole or less of at least one oxide selected from the group consisting of CaO, SrO, BaO, and ZnO.

6. The insulating ceramic composition according to claim 2, wherein the glass powder further contains 10% by mole or less of aluminum oxide on the basis of $Al_2O_3$.

7. The insulating ceramic composition according to claim 2, wherein the glass powder further contains 10% by mole or less of at least one alkaline metal oxide selected from the group consisting of $Li_2O$, $K_2O$, and $Na_2O$ with respect to 100% by mass of the glass powder.

8. The insulating ceramic composition according to claim 2 further comprising 3% by weight or less of copper oxide on the basis of CuO with respect to the total ceramic powder and glass powder content.

9. The insulating ceramic composition according to claim 2, wherein the ratio of the ceramic powder content to the glass powder content is 20:80 to 80:20 on a weight basis.

10. An insulating ceramic comprising a fired insulating ceramic composition according to claim 2.

11. A ceramic multilayer substrate comprising a plurality of ceramic layers and a conductive wire disposed on at least one of the plurality of ceramic layers, wherein the plurality of ceramic layers include an insulating ceramic layer comprising the insulating ceramic according to claim 10.

12. The ceramic multilayer substrate according to claim 11, wherein the plurality of ceramic layers further include a dielectric ceramic layer that is disposed on at least one principal face of the insulating ceramic layer and that has a dielectric constant higher than that of the insulating ceramic layer.

13. A ceramic electronic component comprising the ceramic multilayer substrate according to claim 11 and a circuit element that is mounted on the ceramic multilayer substrate and is electrically connected to the conductive wire.

14. A ceramic electronic component comprising the ceramic multilayer substrate according to claim 13, wherein the circuit element is at least one of an inductor and a capacitor.

15. A method for manufacturing a ceramic multilayer substrate comprising the steps of layering first green ceramic sheets comprising the insulating ceramic composition according to claim 2 to prepare a layered body, providing a second green ceramic sheet having a sintering temperature different from that of the first green ceramic sheets onto at least one principal face of the layered first green ceramic sheets, and firing the layered body including the first green ceramic sheets together with the second green ceramic sheet.

16. The method for manufacturing a ceramic multilayer substrate according to claim 15, wherein the second green ceramic sheet is not substantially sintered at the sintering temperature of the first green ceramic sheets.

17. The method for manufacturing a ceramic multilayer substrate according to claim 16, wherein the layered body including the first green ceramic sheets is fired at 1000° C. or less together with the second green ceramic sheet.

18. An insulating ceramic composition according to claim 1, wherein the titanium oxide is present.

19. The insulating ceramic composition according to claim 18, wherein the titanium oxide is contained in the ceramic powder.

20. The insulating ceramic composition according to claim 19, wherein the content of the titanium oxide is 0.5–15% by weight with respect to the total ceramic powder and glass powder content.

* * * * *